(12) United States Patent
Goroshevskiy et al.

(10) Patent No.: US 8,841,901 B2
(45) Date of Patent: Sep. 23, 2014

(54) SYSTEM AND METHOD FOR INSPECTING A SUBSEA PIPELINE

(76) Inventors: Valerian Goroshevskiy, Moscow (RU); Svetlana Kamaeva, Moscow (RU); Igor Kolesnikov, Moscow (RU)

( * ) Notice: Subject to any disclaimer, the term of this patent is extended or adjusted under 35 U.S.C. 154(b) by 431 days.

(21) Appl. No.: 13/336,302

(22) Filed: Dec. 23, 2011

(65) Prior Publication Data
US 2013/0027029 A1    Jan. 31, 2013

(30) Foreign Application Priority Data

Jul. 29, 2011 (WO) .................. PCT/2011/00572
Dec. 23, 2011 (RU) ........................... 2011152497

(51) Int. Cl.
| G01R 33/12 | (2006.01) |
| G01V 3/10 | (2006.01) |
| G01S 19/49 | (2010.01) |
| G01R 33/028 | (2006.01) |

(52) U.S. Cl.
CPC ............. *G01S 19/49* (2013.01); *G01R 33/0286* (2013.01)

USPC ..................... 324/228; 324/326; 324/329

(58) Field of Classification Search
None
See application file for complete search history.

(56) References Cited

U.S. PATENT DOCUMENTS

| 3,526,831 | A  * | 9/1970 | Smith ............................ 324/559 |
| 4,996,879 | A  * | 3/1991 | Kruka et al. .................... 73/592 |
| 5,764,061 | A  * | 6/1998 | Asakawa et al. ............... 324/326 |
| 6,243,657 | B1 * | 6/2001 | Tuck et al. ..................... 702/150 |
| 7,814,856 | B1 * | 10/2010 | Smith et al. ................... 114/328 |

* cited by examiner

*Primary Examiner* — Minh N Tang
(74) *Attorney, Agent, or Firm* — Nadya Reingand; Yan B. Hankin

(57) ABSTRACT

The present invention is directed to a system and a method for inspecting a subsea pipeline. The method comprises the steps: detecting a defect along the subsea pipeline using a subsea magnetometric tomography method (MTM) module adjacent the subsea pipeline; and determining a position of the subsea MTM module, thereby determining the position of the defect. The method further comprises determining the position of the subsea MTM module relative to a surface vessel; and determining an absolute position of the surface vessel.

16 Claims, 5 Drawing Sheets

SYSTEM AND METHOD FOR INSPECTING A SUBSEA PIPELINE

CROSS REFERENCE TO RELATED APPLICATIONS

This application claims priority to PCT application PCT/RU2011/000572 filed Jul. 29, 2011 and Russian Patent application No. 2011152497 filed Dec. 23, 2011.

FIELD OF INVENTION

The present invention relates broadly to a system and method for inspecting a subsea pipeline.

BACKGROUND

Pipelines, e.g. those used in the oil and gas industry, need regular inspection and maintenance before potentially costly failures occur. A traditional method of assessing the technical condition of a pipeline typically includes flaw detection using in-line inspection (ILI) for detecting location and evaluating parameters of separate metal defects, joining defects into clusters by an expert evaluation method (without indicating the rules of joining), calculating a level of stress-deformed condition (SDC) in cluster zones to assess their danger, and calculating a permissible operating pressure and evaluated factor of repair (EFR) for clusters of corrosion origin based on residual pipe wall thickness with defects of "metal loss" (corrosion) type.

However, there are several limitations to the above method. For example, ILI using intelligent pigging is unavailable for a range of objects that are non-piggable, or requires significant spending to prepare an object for pigs running. While the ILI method is suitable for the first task (the flaw detection itself), it is less advantageous for evaluating the comparative degree of the flaw's danger (e.g. by ranking), or for calculating serviceability of pipeline sections with various defects. Also, traditional calculations consist only in the evaluation of danger of groups of defects (clusters) like "metal loss". The task of evaluating the corrosion rate (corrosion prognosis or monitoring) is not solved, and is typically settled by repeated runs of tools-defectoscopes.

Furthermore, in the above traditional method, there is no evaluation of cracks stability, that is, no prognosis for the rate of crack-like defects development, especially in a longitudinal direction. There is also no evaluation of danger of other types of defects (e.g. welds) due to operation conditions, as the evaluation of metal properties degradation in aggressive conditions and with anomalies of stress-deformed condition (SDC) is not carried out. For example, there are pipeline sections with sags, bends, stresses/stretches/twists, that is, with loss of a pipeline stability, e.g. due to land-washing during heavy rains, in land-slipping areas, precipices, ravines and zones of seismic activity. In addition, the main problem— the degree of stress concentration in a particular pipeline section—is not considered; it must be considered by engineers of the integrity department of the company/operator by e.g. expert evaluation.

As an alternative to the above method, a magnetometric tomography method (MTM) has been proposed. MTM is a non-contact method of non-destructive testing (NDT) and technical diagnostics based on remote scanning the magnetic field of a ferro-magnetic pipeline in a system of orthogonal coordinates. Additionally, manual processing and calibrating are used to define locations of sections with metal defects of various types, identify the type of the most dangerous defects, and evaluate serviceability of defective sections according to the degree of mechanical stress concentration.

However, MTM is currently available only to on-shore (i.e. land-based) applications. Also, the current detection capability of such a magnetometer is only up to a maximum distance of 20 times the pipe diameter. Thus, such conventional MTM systems are not suitable for many subsea (i.e. underwater) pipelines, which may be located at significant depths. The inspection speed is also limited to only about 2 meters per second (m/s), and the recording of distance is typically manual. Also, the analysis of the collected data is substantially manual, i.e. it relies again on expert evaluation.

A need therefore exists to provide a system and method for inspecting a subsea pipeline that seeks to address at least some of the above problems.

SUMMARY

Accordingly, the present invention is directed to a system and a method for inspecting a subsea pipeline which makes it possible to inspect the pipeline on the continental shelf at depths of 200 meters or more with a accurate determination of the location of the defect area and its type, An object of the present invention is to provide a system for inspecting a subsea pipeline, comprising: a submersible magnetometric tomography method (MTM) module movable adjacent the subsea pipeline for detecting a defect along the subsea pipeline; and means for determining a position of the submersible MTM module, thereby determining the position of the defect.

In one aspect of the present invention in the system the means for determining the position of the submersible MTM module comprises means for determining the position of the submersible MTM module relative to a surface vessel; and means for determining an absolute position of the surface vessel.

In another aspect of the present invention in the system the means for determining the position of the submersible MTM module relative to the surface vessel comprises at least one of an odometer, a Doppler velocity log and a microelectromechanical systems (MEMS) accelerometer coupled to the submersible MTM module.

In another aspect of the present invention in the system the means for determining the absolute position of the surface vessel comprises a global positioning system (GPS) receiver.

In another aspect of the present invention in the system time stamps of data from the submersible MTM module and the means for determining the position of the MTM module are synchronized based on a GPS time signal.

In another aspect of the present invention the system further comprising means for categorizing the defect based on at least a density of magnetic field strength distribution along a pipeline axis in an anomaly zone.

In another aspect of the present invention in the system the means for categorizing the defect ranks the defect as one of one, two and three corresponding to immediate repair, scheduled repair and no repair, respectively.

In another aspect of the present invention the system further comprising means for determining a safe operating pressure of the pipeline.

In another aspect of the present invention the system further comprising means for determining a safe operation term of the pipeline.

In another aspect of the present invention in the system he submersible MTM module is mounted to a remotely operated vehicle (ROV).

In another aspect of the present invention in the system the submersible MTM module is disposed at least about 1 meter from the ROV engines.

Another object of the present invention is to provide a method for inspecting a subsea pipeline, the method comprising the steps of: detecting a defect along the subsea pipeline using a submersible magnetometric tomography method (MTM) module adjacent the subsea pipeline; and determining a position of the submersible MTM module, thereby determining the position of the defect.

In one aspect of the present invention in the claimed method the step of determining the position of the submersible MTM module comprises: determining the position of the submersible MTM module relative to a surface vessel; and determining an absolute position of the surface vessel.

In another aspect of the present invention the method further comprising synchronizing time stamps of data from the submersible MTM module and equipment for determining the position of the submersible MTM module based on a GPS time signal.

In another aspect of the present invention the method further comprising categorizing the defect based on at least a density of magnetic field strength distribution along a pipeline axis in an anomaly zone.

In another aspect of the present invention the method further comprising ranking the defect as one of one, two and three corresponding to immediate repair, scheduled repair and no repair, respectively.

In another aspect of the present invention the method further comprising determining a safe operating pressure of the pipeline.

In another aspect of the present invention the method further comprising determining a safe operation term of the pipeline.

The present invention makes it possible to determine the exact location of the submersible MTM module on the pipeline when you move it under the water along the pipeline and thus pinpoint the location of the defect, if it is registered

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
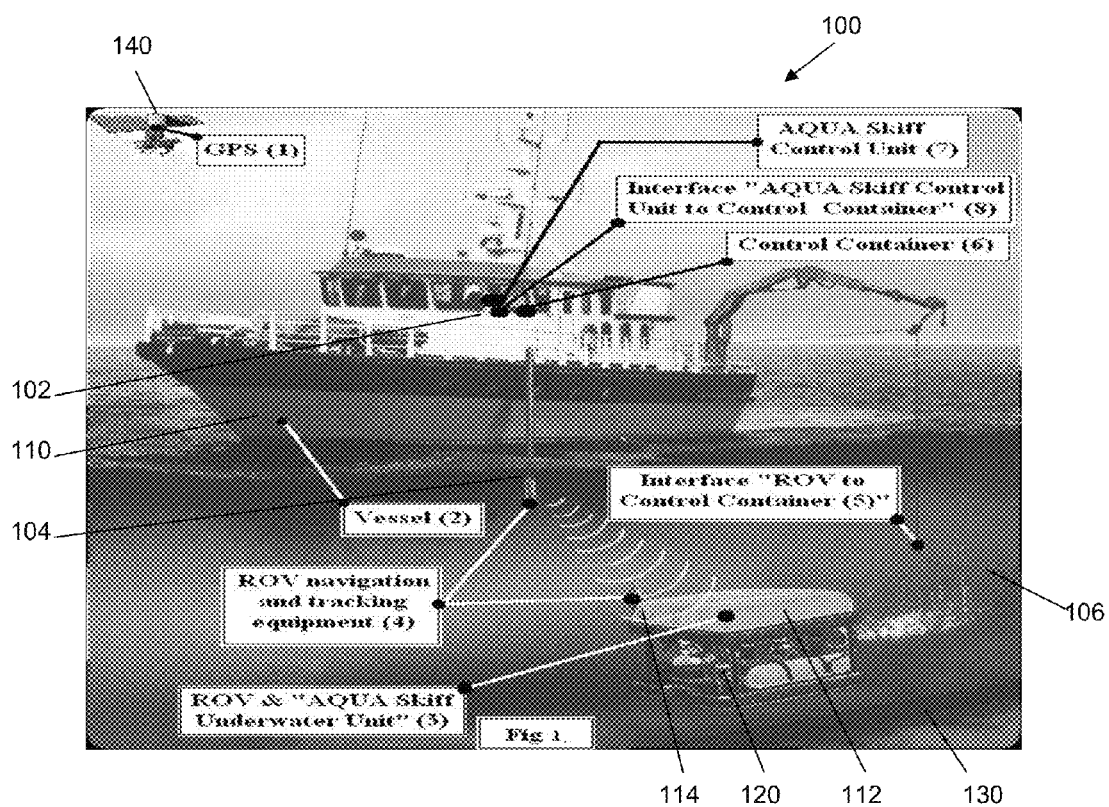
FIG. 1 shows an image illustrating an implementation of a system for inspecting a subsea pipeline according to an example embodiment.
Figure 2:
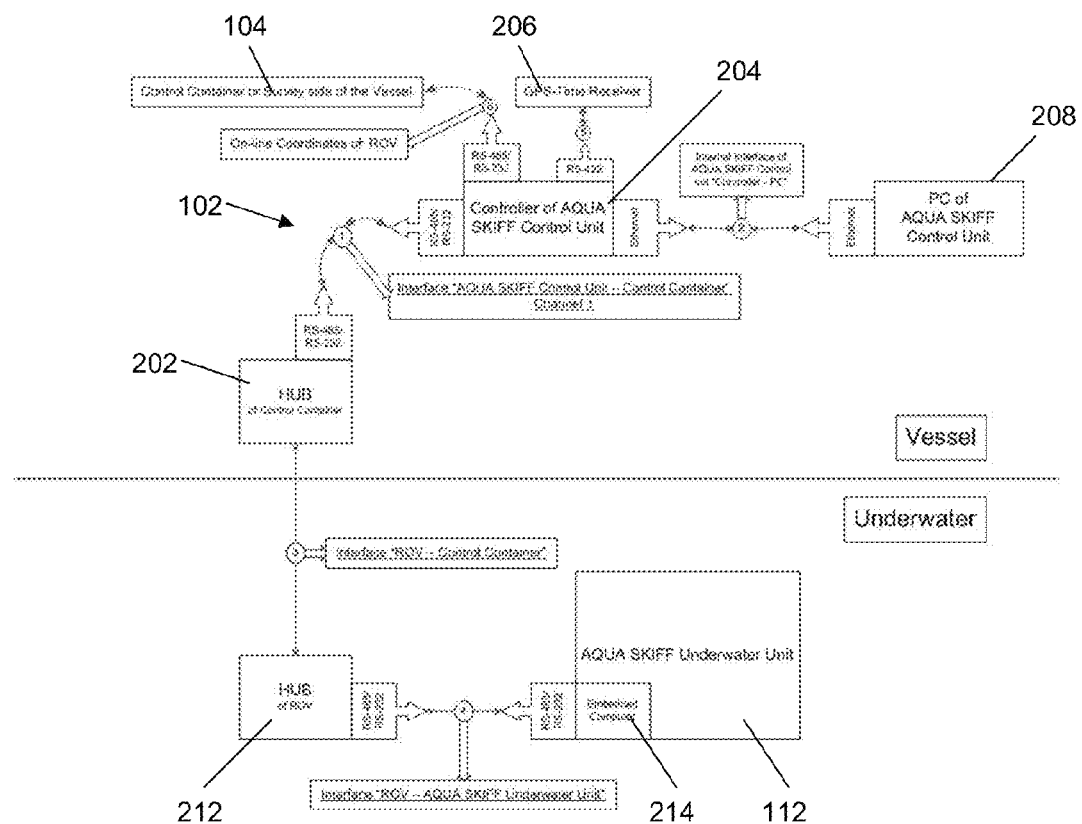
FIG. 2 shows a block diagram illustrating communication interfaces of the system of FIG. 1.

FIG. 1 shows an image illustrating an implementation of a system 100 for inspecting a subsea pipeline 130 according to an example embodiment. FIG. 2 shows a block diagram illustrating communication interfaces of the system of FIG. 1.

In the example embodiment, system 100 comprises a control unit 102 disposed on-board a surface vessel 110 and an underwater unit 112 mounted to a remotely operated vehicle (ROV) 120 that is adjacent to, but not in contact with, the subsea pipeline 130. The ROV 120 is typically tethered to the surface vessel 110 via an umbilical cable or tethering line 106, as will be appreciated by a person skilled in the art. An operator (not shown) on-board the surface vessel 110 can control the ROV 120 to move along the subsea pipeline 130. The surface vessel 110 in the example embodiment is capable of receiving signals (e.g. time and position signals) from a global positioning system (GPS) satellite 140. In addition, the surface vessel 110 and the underwater unit include respective navigation and tracking equipment 104, 114. The navigation and tracking equipment 104 comprises GPS navigation equipment for the surface vessel 110 as well as equipment for tracking the ROV 120.

As can be seen from FIG. 2, the underwater unit 112 comprises an embedded computer 214 in communication with a hub 212 of the ROV 120 (FIG. 1). The hub 212 of the ROV 120 is in communication with the control unit 102 via a hub 202. The control unit 102 further comprises a controller 204 and a computing device in the form of a personal computer (PC) 208. The controller 204 is in communication with a GPS Time Receiver 206 and navigation equipment 104 of the surface vessel 110. Suitable communication interfaces between relevant components as described above include, but are not limited to RS-485, RS-232, RS-422 and Ethernet, as will be appreciated by a person skilled in the art.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "scanning", "calculating", "determining", "replacing", "generating", "initializing", "outputting", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also implicitly discloses a computer program, in that it would be apparent to the person skilled in the art that the individual steps of the method described herein may be put into effect by computer code. The computer program is not intended to be limited to any particular programming language and implementation thereof It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer readable medium may also include a hard-wired medium such as exemplified in the Internet system, or wireless medium such as exemplified in the GSM mobile telephone system. The computer program when loaded and executed on such a general-purpose computer effectively results in an apparatus that implements the steps of the preferred method.

Referring back to FIGS. 1 and 2, in the example embodiment, the underwater unit 112 senses and records the magnetic field (e.g. in micro Tesla (μT) unit in the X-axis, Y-axis and Z-axis respectively) emitted by the stressed pipe wall as the ROV 120 moves along the pipeline 130. Magnetic field data is typically captured on about every 2 centimeters (cm) distance passed in the example embodiment, by using at least one of e.g. an odometer, a Doppler velocity log and a microelectromechanical systems (MEMS) accelerometer to track the distance passed. The underwater unit 112 does not capture readings of magnetometric data at the same spot when the ROV 120 is not moving.

In addition, in the example embodiment, the GPS time signal received by the GPS Time Receiver 206 is provided to all components of system 100, including the underwater unit 112, such that all data of system 100 is synchronized to GPS time. For example, the time stamps on a navigation log of the surface vessel 110 are matched with those on a magnetometer log of the underwater unit 112.

Figure 3:
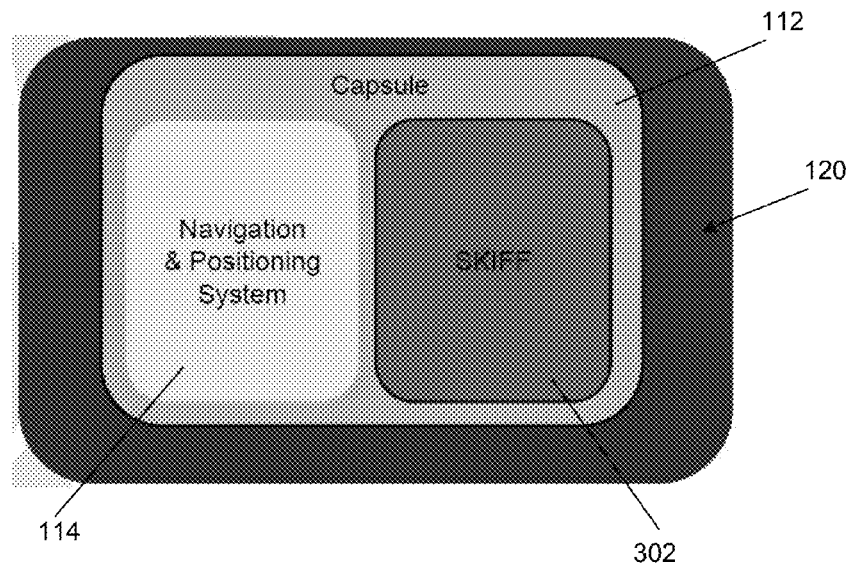
FIG. 3 shows a block diagram illustrating an arrangement of components on the ROV of FIG. 1 according to an example embodiment.

FIG. 3 shows a block diagram illustrating an arrangement of components on the ROV 120 of FIG. 1 according to an example embodiment. As can be seen from FIG. 3, the underwater unit 112 is enclosed in a water-proof capsule and mounted to the ROV 120. The underwater unit 112 comprises a submersible magnetometric tomography method (MTM) module 302 (e.g. Model No. Scythian MBS SKIF-04 manufactured by Transkor-K) for sensing and recording magnetic field data and navigation and positioning equipment 114 for recording positional data.

Figure 4:
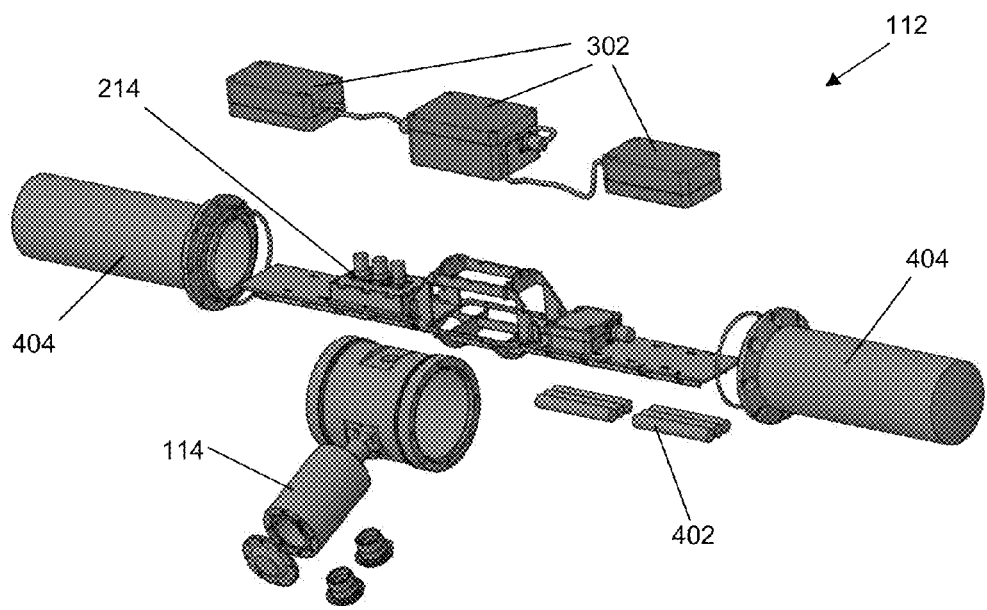
FIG. 4 shows an exploded view of an implementation of the underwater unit of FIG. 3 according to an example embodiment.
Figure 5:
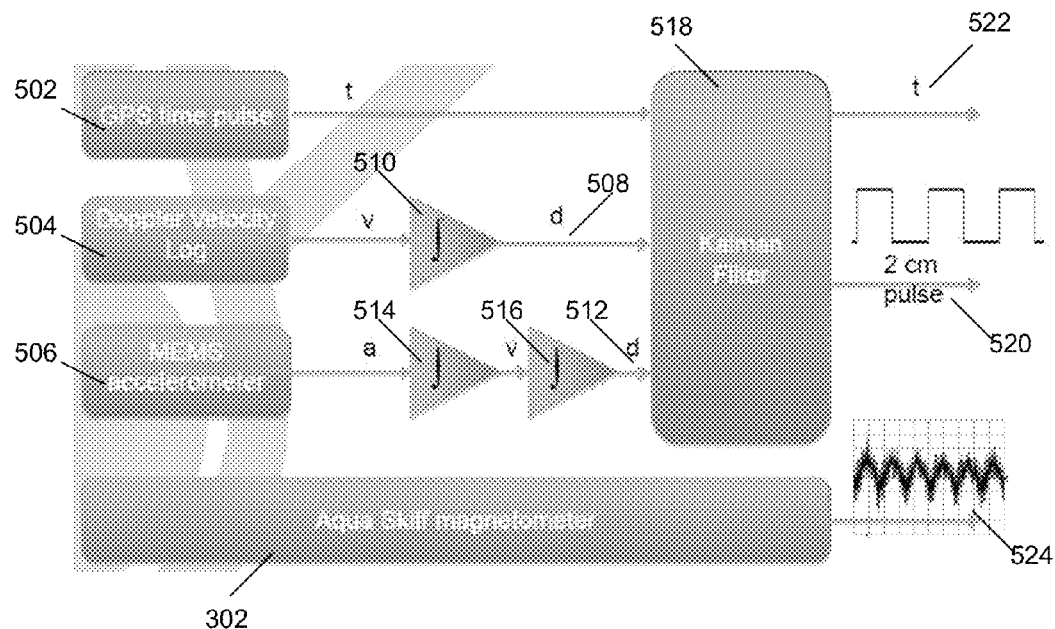
FIG. 5 shows a schematic diagram illustrating an operation of the system of FIG. 1 according to an example embodiment.

FIG. 4 shows an exploded view of an implementation of the underwater unit 112 of FIG. 3 according to an example embodiment. In addition to the submersible MTM module 302 and the navigation and positioning equipment 114, the underwater unit 112 comprises an embedded computer 214 (as also shown in FIG. 2), a power supply in the form of batteries 402, and a water-proof casing 404 forming the capsule. The casing 404 is typically fabricated from a non-ferromagnetic material. Also, the underwater unit 112 is preferably disposed at least about 1 meter (m) from the engines of the ROV 120 in the example embodiment to minimise echo FIG. 5 shows a schematic diagram illustrating an operation of the system 100 of FIG. 1 according to an example embodiment. As can be seen in FIG. 5, inputs to the navigation and positioning equipment 114 (FIG. 1) in the example embodiment includes a GPS time pulse 502 as received by the GPS Timer Receiver 206 (FIG. 2) and synchronized throughout the system 100, Doppler velocity log data 504 and MEMS accelerometer data 506. The Doppler velocity log data 504, which is typically in terms of speed measured in cm/s, is converted to distance data 508 (e.g. in cm) via a function 510, e.g. using the embedded computer 214 (FIG. 2). Similarly, the MEMS accelerometer data 506, which is typically in terms of acceleration measured in m/s$^2$, is converted to distance data 512 (e.g. in cm) via successive functions 514, 516. The time pulse 502 and distance data 508, 512 are then provided to a Kalman filter 518 for generating a single distance pulse 520, e.g. a 2 cm pulse, with corresponding time data 522. In the example embodiment, the Kalman filter 518 is capable of selecting the best reading from two or more sources (i.e. inputs), as will be understood by a person skilled in the art.

At the same time, in the example embodiment, the submersible MTM module 302, which senses and records the magnetic field emitted by the pipe wall at about 2 cm intervals, generates magnetometric data 524 corresponding to the distance pulse 520 and time data 522 above. The distance pulse 520, time data 522 and magnetometric data 524 are transmitted to the control unit 102 (FIG. 1) for further processing, e.g. calculating position of any defect/anomaly, calculating severity of such defect/anomaly.

The system 100 of the example embodiment is capable of operating in either an on-line mode or an off-line mode. In the on-line mode, the system 100 receives both magnetometric data with GPS time stamps and navigation data in real-time. In the off-line mode, the system 100 receives real-time magnetometric data, but receives navigation data only after the mission has been completed, e.g. via a removable device such as a Universal Serial Bus (USB) flash drive. Typically, the navigation data includes at least the absolute coordinates of the ROV 120 (hence, the underwater unit 112 and any defect/anomaly) with GPS time stamps, and Kilometer Post data (distance traveled by the ROV 120 along the pipeline since the beginning of the movement) In the example embodiment, the navigation data is provided in American Standard Code for Information Interchange (ASCII) codes. The magnetometric data and navigation data are saved together in a database of the PC 208 of the control unit 102 (FIG. 2) for further processing.

Table 1 shows details of the navigation data in the example embodiment.

TABLE 1

| Field | Description |
|---|---|
| DD/mm/yy | date |
| Hh:mm:ss.ss | 1PPS GPS time |
| XF.xx | Easting of ROV |
| YF.yy | Northing of ROV |
| SF.xx | KP of ROV |
| | (Distance along the Pipeline) |
| CFF | ROV depth |
| XVV.x | ROV heading |
| sDVVV | CP Values |
| | (Controlled Parameter) |

Table 2 shows details of the magnetometric data in the example embodiment.

TABLE 2

| Field | Description |
|---|---|
| DD/mm/yy | date |
| Hh:mm:ss.ss | 1PPS GPS time |
| $H_x$ | X-axis magnetometric value |
| $H_y$ | Y-axis magnetometric value |
| $H_z$ | Y-axis magnetometric value |

For example, the PC 208 calculates the coordinates of the ROV 120 relative to the surface vessel 110 at a particular time stamp based on the ROV 120 navigation data. These coordinates are then combined with the absolute coordinates of the surface vessel 110 received from the GPS satellite at that time stamp to determine the absolute coordinates of the ROV. If an anomaly in the magnetometric data is found at the same time stamp, such anomaly is associated with the coordinates that have been determined. By compiling and processing all data collected from an inspection mission, locations of potential defects, which correspond to the anomalies in magnetometric data, are determined in the example embodiment.

Furthermore, the system of the example embodiment is capable of evaluating a danger degree of a defect, calculating a pipeline safe operating pressure and calculating a pipeline safe operation term. An integral index F of danger degree of a defect that takes into account the extent of magnetic anomaly, amplitude and shape of distribution of magnetic field intensity vector over the background values is calculated in the example embodiment based on the following formula:

$$F = A \cdot e^{\left(1 - \frac{Q_\phi}{Q_{aH}}\right)} \qquad (1)$$

where A denotes a corrective coefficient characterizing influence of defects of pipelines upon the magnetic field change and is typically determined after a calibration procedure; $Q_{AH}$, $Q_\Phi$ denote density of magnetic field strength distribution along a pipeline axis in anomaly zone and in a "calm" background area, $A/_M$, respectively. The density is typically determined as a length of a section of a curve.

In the example embodiment, the curve comprises a geometrical place of points of intensity of a magnetic field in space, thus:

$$dQ = \sqrt{dH_x^2 + dH_y^2 + dH_z^2} \qquad (2)$$

where $dH_x$, $dH_y$, $dH_z$ denote values of change of magnetic field strength vector, $A/_M^2$, respectively.

In the example embodiment, $Q_{AH}$ and $Q_\Phi$ are calculated by integrating dQ by length of anomaly and background sections, respectively.

The calculated values of index F are maintained e.g. in a database of revealed defects, and also in diagrams of anomalies distribution. Table 2 provides a ranking of sites (i.e. locations) with magnetic anomalies based their danger degree. On sites with the first danger rank, the first priority repair-reconstruction works are carried out. On sites with the second danger rank, planned repair-reconstruction works are scheduled. On sites with the third danger rank, the operation of the pipeline is allowed without repair-reconstruction works.

TABLE 2

| No | Value of integral index F | Danger degree of magnetic anomaly, rank |
|---|---|---|
| 1 | from 0 to 0.2 | first |
| 2 | from 0.22 to 0.55 | second |
| 3 | from 0.55 to 0.99 | third |

Additionally, in the example embodiment, the safe operating pressure $P_{safe}$ is calculated based on the respective danger degree of the defect.

For sections with defects of the first danger rank (i.e. 0≤F<0.2), $$\text{at } F < 0.1: P_{safe} = 0.9 P_{oper} + 0.1 P_{oper} \cdot F \qquad (3)$$

$$\text{at } 0.1 \leq F < 0.2: P_{safe} = 0.9 P_{oper} + 0.05 P_{oper} \cdot F \qquad (4)$$

For sections with defects of the second danger rank (i.e. 0.2≤F<0.55):

$$P_{safe} = 1.01 P_{oper} + 0.05 P_{oper} \cdot F \qquad (5)$$

For sections with defects of the third danger rank (i.e. F≥0.55):

$$P_{safe} = 1.06 P_{oper} + (0.95 P_{design} - 1.06 P_{oper}) \cdot F \qquad (6)$$

where $P_{oper}$ denotes pressure in a pipeline at the moment of inspection, measured in megapascals (MPa); $P_{design}$ denotes design pressure in a pipeline (in MPa); and $P_{safe}$ denotes calculated safe operating pressure in a pipeline (in MPa).

If the value of calculated safe operating pressure $P_{safe}$ exceeds the design pressure $P_{design}$, the pipeline is preferably operated at the design pressure. The assessment of pipeline technical condition can also be carried out based on the coefficient of safe pressure "CSP" where:

$$CSP = \frac{P_{oper}}{P_{safe}} \qquad (7)$$

In the example embodiment, at CSP≥1, a defect is assessed as extreme and subject to the first priority repair.

For a pipeline short-term operation, the maximum admissible operating pressure $P_{max}$ (also known as MAOP) is calculated in the example embodiment:

$$P_{max} = P_{safe} \cdot \tau \qquad (8)$$

where τ denotes a coefficient of the short-term increase of pressure, which is determined by the operating organization and may range from 1.1 to 1.15 in the example embodiment.

The pipeline safe (i.e. accident-free) operation term $T_{safe}$ is calculated in the example embodiment on the condition that the pipeline is operated at the calculated safe pressure, as described above with respect to Equations (3)-(6). After having repaired all revealed defects the pipeline safe operation term is fixed no more than 90% from calculated value. lease explain what is meant by "fixed no more than 90% from For each revealed defect, the calculations are carried out in the example embodiment by the following formula:

$$T_{safe} = K_p \cdot K_F \cdot K_t \qquad (9)$$

where $K_p$ denotes a coefficient considering the pressure in the pipeline; $K_F$ denotes a coefficient considering danger degree of a defect; and $K_t$ denotes a coefficient which takes into account the term of a pipeline operation.

For example, if the pipeline is operated at the design pressure, $K_p = 1$, otherwise:

$$\hat{E}_\delta = e^{1-\frac{P_{design}}{P_{oper}}} \quad (10)$$

$$\text{Also, } K_F = -2Lg\sqrt{1-F} \quad (11)$$

$K_t$ considers the influence of operation factors, in particular, the probability of a pipeline failure within the first 3 years of operation because of construction-assembly defects and because of corrosion damage after 5-7 years of operation.

$$K_t = 10 \cdot \frac{T}{\Delta T} \quad (12)$$

where T denotes the normative operation term of a pipeline (measured in years), and $\Delta T$ denotes the operation term of a pipeline since the moment of its putting into operation (measured in years).

Figure 6:
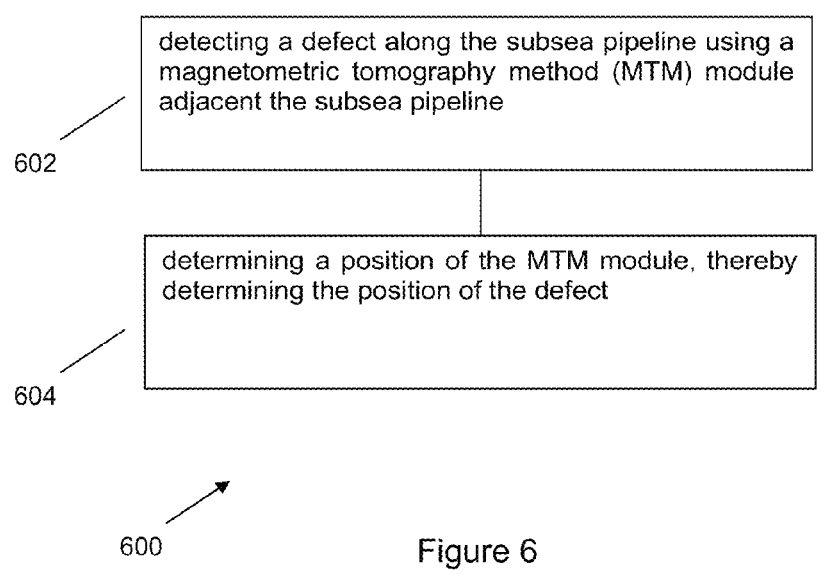
FIG. 6 shows a flow chart illustrating a method for inspecting a subsea pipeline according to an example embodiment.

FIG. 6 shows a flow chart 600 illustrating a method for inspecting a subsea pipeline according to an example embodiment. At step 602, a defect along the subsea pipeline is detected using a submersible magnetometric tomography method (MTM) module adjacent the subsea pipeline. At step 604, a position of the submersible MTM module is determined, thereby the position of the defect is determined.

The method and system of the example embodiment can advantageously allow non-piggable subsea pipelines from an on-shore location. Even for piggable subsea pipelines, the need for pipeline preparation prior to inspection (e.g. (cleanup of a pipe internal cavity, geometric inspection before runs of diagnosing tool-defectoscopes, placement of reference points, magnetization of a pipeline metal) is advantageously eliminated. Additional facilities for pig launching/receiving are also not required. Thus, a cost reduction may be achieved compared to conventional methods such as intelligent pigging.

Additionally, the method and system of the example embodiment can have a high sensitivity due to the non-contact registration of the pipeline magnetic field and the filtration of relevant signal over noise. This means that metal defects causing stress-deformed conditions are typically not missed during inspection. Advantageously, the magnetic field change of the whole defective section (cluster)—not a separate defect—is registered in the example embodiment. That is, the method and system of the example embodiment can provide a quantitative assessment of stress concentrator F for all interconnected defects of the registered magnetic anomaly (or stress-deformed condition anomaly resulting from a cluster).

Furthermore, the method and system of the example embodiment can advantageously be a single tool for inspection of different sizes of pipelines, and allow evaluating the danger degree of defects of various types on the basis of the unified quantitative index F of stress-concentrator value. Preferably, this allows calculating EFR for the defects of "metal loss" type and other types such as: "crack-like defects", weld defects, "continuity failure", "geometry change", etc. Thus, the calculations of serviceability for all types of defects—not only "metal loss" type—can be made possible.

Figure 7:
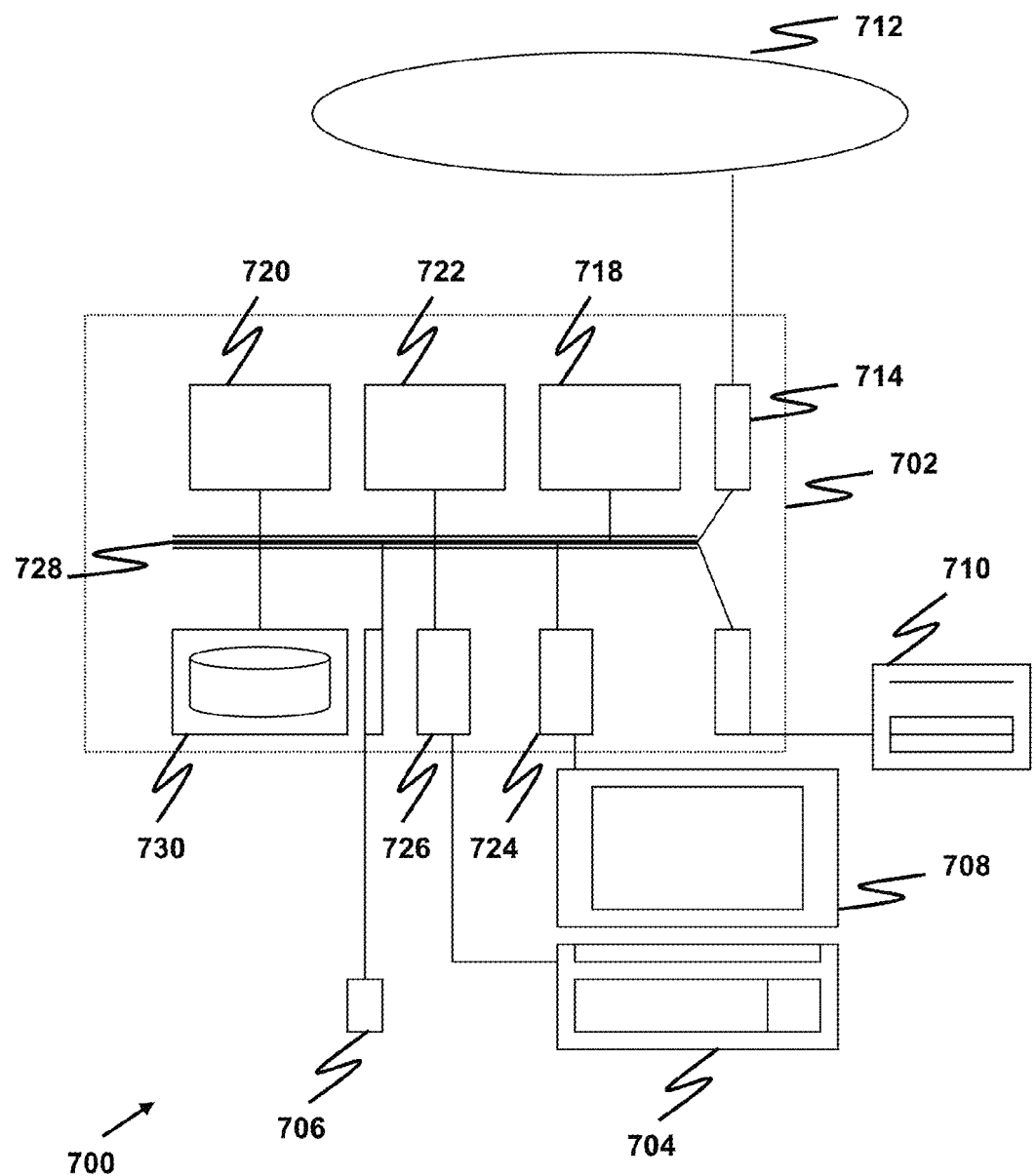
FIG. 7 shows a block diagram illustrating a computing device for implementing the method and system of the example embodiment.

The method and system of the example embodiment can be implemented on a computer system 700, schematically shown in FIG. 7. It may be implemented as software, such as a computer program being executed within the computer system 700, and instructing the computer system 700 to conduct the method of the example embodiment.

The computer system 700 comprises a computer module 702, input modules such as a keyboard 704 and mouse 706 and a plurality of output devices such as a display 708, and printer 710.

The computer module 702 is connected to a computer network 712 via a suitable transceiver device 714, to enable access to e.g. the Internet or other network systems such as Local Area Network (LAN) or Wide Area Network (WAN).

The computer module 702 in the example includes a processor 718, a Random Access Memory (RAM) 720 and a Read Only Memory (ROM) 722. The computer module 702 also includes a number of Input/Output (I/O) interfaces, for example I/O interface 724 to the display 708, and I/O interface 726 to the keyboard 704.

The components of the computer module 702 typically communicate via an interconnected bus 728 and in a manner known to the person skilled in the relevant art.

The application program is typically supplied to the user of the computer system 700 encoded on a data storage medium such as a CD-ROM or flash memory carrier and read utilising a corresponding data storage medium drive of a data storage device 730. The application program is read and controlled in its execution by the processor 718. Intermediate storage of program data maybe accomplished using RAM 720.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A system for inspecting a subsea pipeline, comprising:
a submersible magnetometric tomography method (MTM) module movable adjacent the subsea pipeline for detecting a defect along the subsea pipeline; and
means for determining a position of the submersible MTM module, thereby determining the position of the defect.

2. The system as claimed in claim 1, wherein the means for determining the position of the submersible MTM module comprises:
means for determining the position of the submersible MTM module relative to a surface vessel; and
means for determining an absolute position of the surface vessel.

3. The system as claimed in claim 2, wherein the means for determining the position of the submersible MTM module relative to the surface vessel comprises at least one of an odometer, a Doppler velocity log and a microelectromechanical systems (MEMS) accelerometer coupled to the submersible MTM module.

4. The system as claimed in claim 2, wherein the means for determining the absolute position of the surface vessel comprises a global positioning system (GPS) receiver.

5. The system as claimed in claim 4, wherein time stamps of data from the submersible MTM module and the means for determining the position of the submersible MTM module are synchronized based on a GPS time signal.

6. The system as claimed in claim 1, further comprising means for categorizing the defect based on at least a density of magnetic field strength distribution along a pipeline axis in an anomaly zone.

7. The system as claimed in claim 6, wherein the means for categorizing the defect ranks the defect as one of one, two and three corresponding to immediate repair, scheduled repair and no repair, respectively.

8. The system as claimed in claim 6, further comprising means for determining a safe operating pressure of the pipeline.

9. The system as claimed in claim 6, further comprising means for determining a safe operation term of the pipeline.

10. The system as claimed in any of the 1-9 claims, wherein the submersible MTM module is mounted to a remotely operated vehicle (ROV).

11. The system as claimed in claim 10, wherein the submersible MTM module is disposed at least about 1 meter from the ROV engines.

12. A method for inspecting a subsea pipeline, the method comprising the steps of:
    detecting a defect along the subsea pipeline using a submersible magnetometric tomography method (MTM) module adjacent the subsea pipeline; and
    determining a position of the submersible MTM module, thereby determining the position of the defect.

13. The method as claimed in claim 12, wherein the step of determining the position of the submersible MTM module comprises:
    determining the position of the submersible MTM module relative to a surface vessel; and
    determining an absolute position of the surface vessel.

14. The method as claimed in claim 13, further comprising synchronizing time stamps of data from the submersible MTM module and equipment for determining the position of the submersible MTM module based on a GPS time signal.

15. The method as claimed in any one of claims 12 to 14, further comprising categorizing the defect based on at least a density of magnetic field strength distribution along a pipeline axis in an anomaly zone.

16. The method as claimed in claim 15, further comprising ranking the defect as one of one, two and three corresponding to immediate repair, scheduled repair and no repair, respectively.

\* \* \* \* \*